United States Patent [19]
Hashimoto et al.

[11] Patent Number: 5,945,161
[45] Date of Patent: Aug. 31, 1999

[54] APPARATUS AND METHOD FOR SUPPLYING PROCESS SOLUTION TO SURFACE OF SUBSTRATE TO BE PROCESSED

[75] Inventors: Hiroshi Hashimoto; Kiyohisa Tateyama; Kiyomitsu Yamaguchi; Yoshitaka Matsuda, all of Kumamoto; Norio Uchihira, Kumamoto-ken; Mitsuhiro Sakai, Kumamoto-ken; Fumio Satou, Kumamoto-ken, all of Japan

[73] Assignee: Tokyo Electron Limited, Tokyo, Japan

[21] Appl. No.: 08/993,021

[22] Filed: Dec. 18, 1997

[30] Foreign Application Priority Data

Dec. 27, 1996 [JP] Japan ................................. 8-350994
May 20, 1997 [JP] Japan ................................. 9-144566

[51] Int. Cl.⁶ .................................................... B05D 3/12
[52] U.S. Cl. ...................... 427/240; 427/385.5; 427/335; 118/52
[58] Field of Search .............................. 118/52; 427/240, 427/335, 385.5, 3

[56] References Cited

U.S. PATENT DOCUMENTS 5,626,913   5/1997   Tomoeda et al. ...................... 427/299
5,798,140   8/1998   Parodi et al. ........................... 427/240
5,853,803  12/1998   Tateyama et al. ...................... 427/240

*Primary Examiner*—Janyce Bell
*Attorney, Agent, or Firm*—Oblon, Spivak, McClelland, Maier & Neustadt, P.C.

[57] ABSTRACT

Disclosed is a processing apparatus comprising holding means, support means, process solution supply means, life means, and rotating means. A substrate to be processed is rotatably held by the holding means. An overhanging portion of the substrate extending over an edge of the holding means is supported by the support means to maintain a front surface of the substrate horizontally flat. A process solution is supplied from the process solution supply means onto the front surface of the substrate held by the holding means and supported by the support means. The substrate held by the holding means is vertically moved by the lift means relative to the support means. Further, the substrate moved upward relative to the support means is rotated by the rotating means.

21 Claims, 10 Drawing Sheets

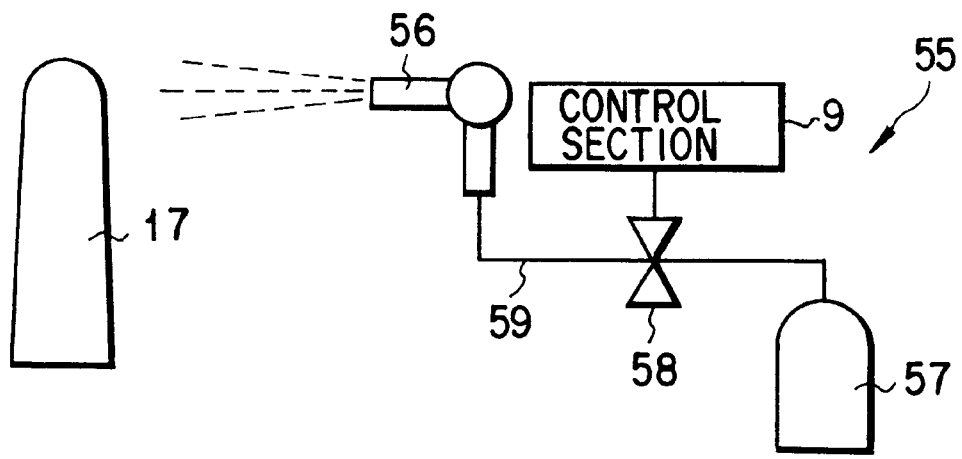
F I G. 7
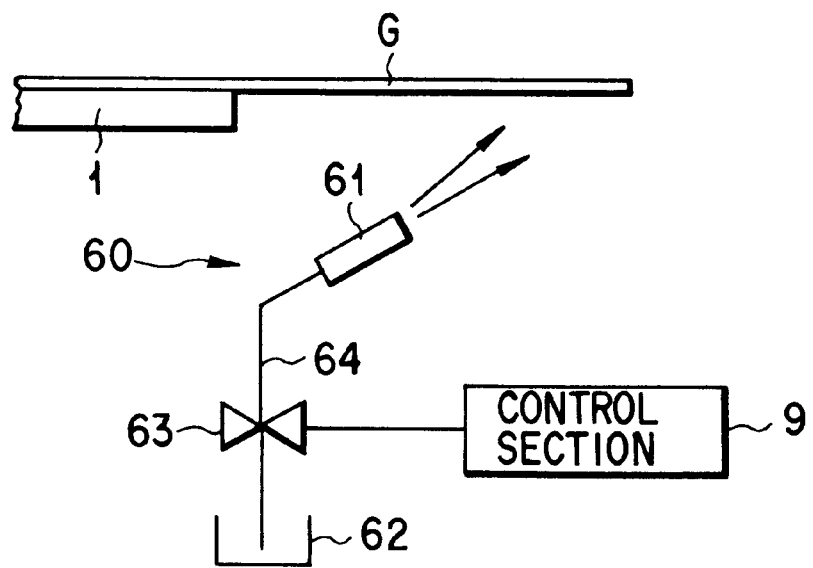
F I G. 8

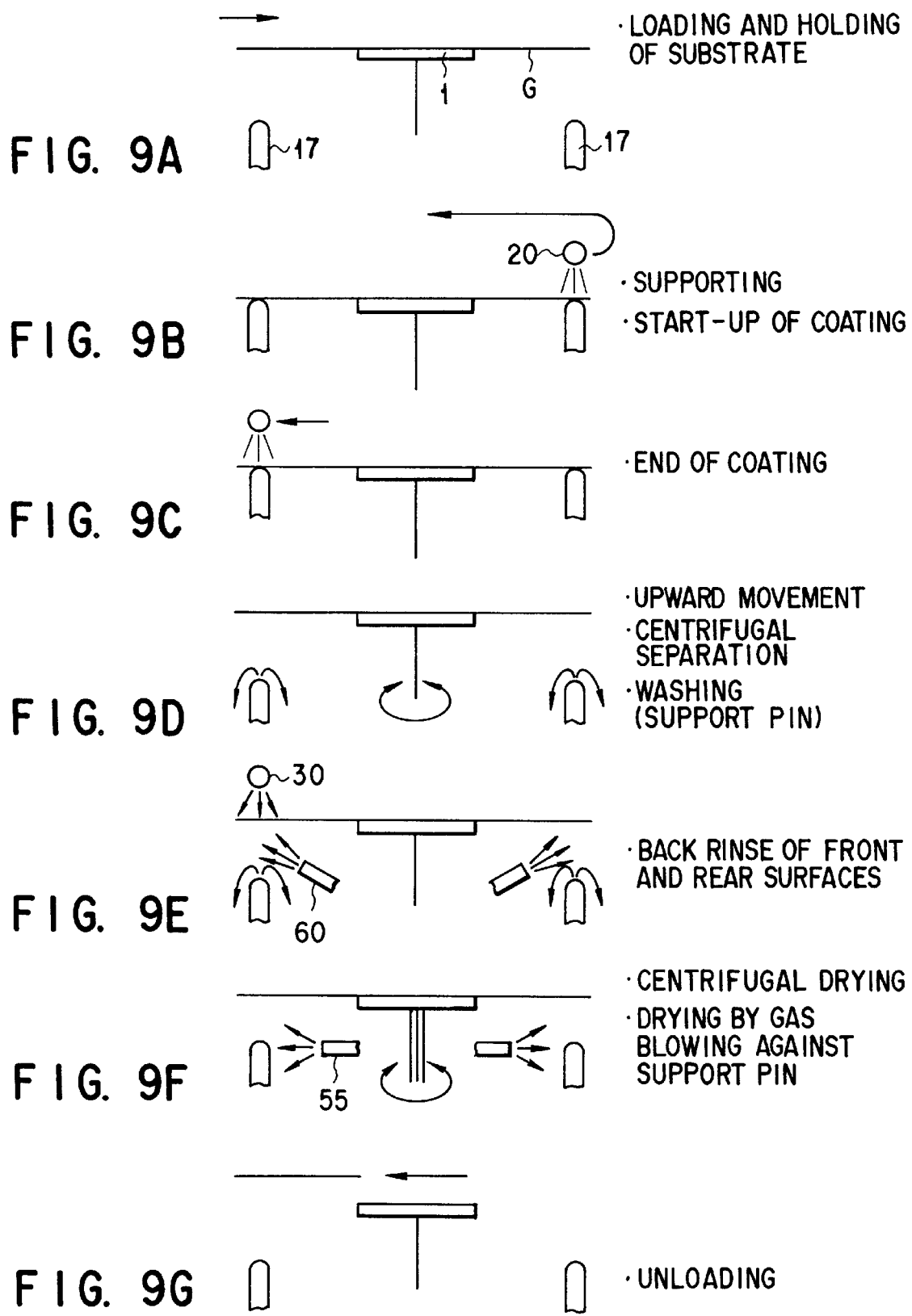

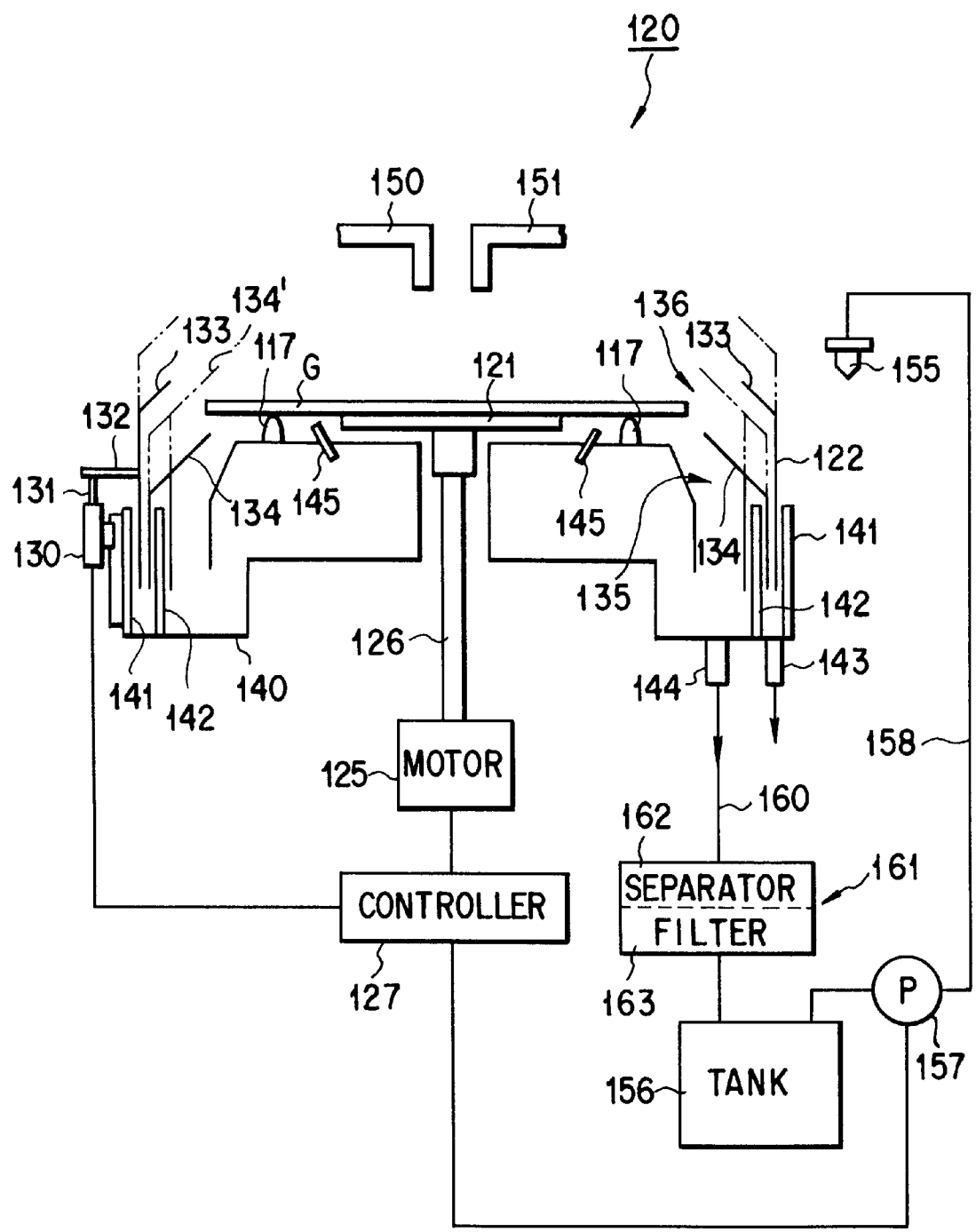
F I G. 11

APPARATUS AND METHOD FOR SUPPLYING PROCESS SOLUTION TO SURFACE OF SUBSTRATE TO BE PROCESSED

BACKGROUND OF THE INVENTION

The present invention relates to an apparatus and method for coating a surface of a substrate to be processed such as an LCD (liquid crystal display) substrate or a semiconductor wafer with a process solution such as a developing solution.

In the manufacture of, for example, a liquid crystal display (LCD) device, a thin film of, for example, ITO (Indium Tin Oxide), an electrode pattern, etc. are formed on an LCD substrate (glass substrate). Therefore, applied is a series of processing, in which a circuit pattern, etc. is transferred in a reduced fashion onto a photo-resist by using a photolithography technology similar to that employed in the manufacture of a semiconductor device, followed by developing the circuit pattern, etc. transferred onto the photo-resist.

To be more specific, a substrate such as a rectangular LCD substrate is disposed on a spin chuck capable of a high speed rotation to coat a surface of the LCD substrate with photo-resist while rotating the substrate at a high speed, followed by selectively exposing the photo-resist to light in a light-exposure device to form a pattern. Then, the LCD substrate after the light-exposure step is disposed to face a nozzle for supplying a process solution such as a developing solution. Under this condition, the LCD substrate and the nozzle are moved relative to each other to form a film of a developing solution, which is upheaved by surface tension of the solution, on the LCD substrate, thereby to perform development for a predetermined time. Then, a deionized water or pure water is supplied to the substrate while rotating the spin chuck at a high speed so as to centrifugally remove the developing solution and, thus, to stop the developing treatment.

In the conventional process, however, a serious problem is brought about. Specifically, a substrate G disposed on a spin chuck 1 is larger than the spin chuck 1 and, thus, extends over an edge of the spin chuck 1 to form an overhanging portion, as shown in FIG. 1. Also, the overhanging portion is bent downward, and the bending degree is increased with increase in the overhanging amount. Naturally, a process solution supplied to the substrate G flows toward the periphery of the substrate, making it difficult to coat uniformly the substrate G with the process solution.

The overhanging amount can be diminished by enlarging the spin chuck 1. However, the manufacturing cost is increased if the spin chuck is enlarged. Also, when it comes to, particularly, a spin chuck of an air suction type, the enlargement of the spin chuck causes an increase in the air-sucking amount, leading to an increased possibility of dust attachment to the substrate G.

It should also be noted that, in the conventional developing process of this type, the developing solution is recovered. However, the recovered developing solution is considerably diluted with a rinsing liquid. As a result, it is difficult to adjust the concentration of the recovered developing solution. In some cases, it is impossible to reuse the recovered developing solution.

BRIEF SUMMARY OF THE INVENTION

An object of the present invention is to provide an apparatus and method for coating uniformly a surface of a substrate to be processed with a process solution while maintaining the substrate surface horizontally flat without enlarging a spin chuck.

Another object is to provide an apparatus and method for processing a substrate, in which a process solution is prevented from being attached to a rear surface of the substrate in the step of centrifugally removing the process solution by rotating the substrate.

Still another object is to provide a processing method which permits preventing the concentration of the recovered process solution from being excessively lowered, making it possible to regenerate the recovered process solution easily.

According to a first aspect of the present invention, there is provided a processing apparatus, comprising holding means for rotatably holding a substrate to be processed, support means for supporting an overhanging portion of the substrate extending over an edge of the holding means so as to maintain the substrate surface horizontally flat, process solution supply means for supplying a process solution to a front surface of the substrate held by the holding means and supported by the support means, lift means for vertically moving the substrate held by the holding means relative to the support means, and rotating means for rotating the substrate moved upward relative to the support means.

It is desirable to mount a washing liquid flow-out portion at a tip of the support portion of the support means to permit a washing liquid to flow out.

It is also desirable to mount a drying means for blowing a drying gas against the tip of the support portion of the support means.

Further, it is desirable to mount a supply means for supplying an after-treating solution to a front surface of the substrate and, at the same time, a washing liquid to a rear surface of the substrate.

According to a second aspect of the present invention, there is provided a processing method, comprising the steps of (a) coating a front surface of a substrate to be processed with a process solution, the substrate being held by holding means and having an overhanging portion supported by support means to maintain the front surface of the substrate horizontally flat, and the overhanging portion extending over an edge of the holding means, (b) moving upward the substrate held by the holding means relative to the support means, (C) and rotating the holding means to centrifugally remove the process solution from the substrate.

It is possible to add after the step (C) an additional step of supplying an after-treating solution to the front surface of the substrate and, at the same time, a washing liquid to a rear surface of the substrate.

It is also possible to allow the washing liquid to flow out through a tip of the support means during the step (C).

Further, it is possible to blow a drying air against the tip of the support means after completion of flow-out of the washing liquid through the tip of the support means.

In the present invention, the overhanging portion of the substrate extending over an edge of the holding means is supported by the support means. It follows that, even in the case of processing a large substrate having a large overhanging portion, the substrate surface can be maintained horizontally flat, making it possible to coat uniformly the front surface of the substrate with a process solution.

Also, the tip of the support means is washed by flow-out of washing liquid in the step of centrifugally removing the process solution. It follows that the process solution is not attached to the support means and, thus, is not attached to the rear surface of a substrate which is to be newly processed.

Further, the drying means permits promptly drying the support means so as to prevent the washing liquid from being attached to the substrate which is to be newly processed.

Further, after the centrifugal removal of the process solution for the drying purpose, an after-treating liquid is supplied to the front surface of the substrate and, at the same time, the rear surface of the substrate is washed with a washing liquid. The particular processing prevents the process solution from being attached to the rear surface of the substrate.

It is possible for the processing method of the present invention to comprise additional steps of arranging a recovery vessel to surround the substrate, rotating the substrate at a first rotation speed to centrifugally remove the process solution from the substrate surface, the removed process solution being recovered in the recovery vessel, supplying a washing liquid onto the front surface of the substrate while rotating the substrate at a second rotation speed so as to wash the substrate, and rotating the substrate at a third rotation speed so as to dry the substrate.

In the processing method of the present invention, a process solution is supplied onto a front surface of the substrate. The supplied process solution is left to stand for a predetermined time to process the substrate. Then, a recovery vessel is arranged to surround the substrate. Under this condition, the substrate is rotated at a first rotation speed so as to centrifugally remove the process solution from the substrate and recover the removed process solution in the recovery vessel arranged to surround the substrate. As a result, it is possible to recover the process solution whose concentration is not remarkably lowered.

The first rotation speed of the substrate can be set at, for example, 50 to 150 rpm. In this case, the process solution on the substrate surface can be recovered substantially completely in the recovery vessel in such a short time as about 1 to 3 seconds. It is possible to supply a washing liquid onto the front surface of the substrate during the process solution recovery step.

In the subsequent washing step, a washing liquid is supplied onto the front surface of the substrate, and the substrate is rotated at a second rotation speed so as to wash the substrate. The second rotation speed can be set at, for example, 100 to 200 rpm. In this washing step, it is possible to supply a washing liquid onto the rear surface of the substrate so as to wash simultaneously the rear surface of the substrate. It is desirable not to arrange the recovery vessel to surround the substrate in the washing step.

Further, the substrate is rotated at a third rotation speed in the subsequent drying step so as to dry the substrate. The third rotation speed can be set at, for example, 1200 to 2000 rpm. In this case, the substrate surface can be dried in about 20 seconds. If the third rotation speed exceeds 2000 rpm, the washing liquid centrifugally removed from the substrate surface is scattered to form a mist, with the result that the washing liquid is attached again to the substrate surface. On the other hand, if the third rotation speed is lower than 1200 rpm, an unduly long drying time is required, leading to a long processing time. It is desirable not to arrange the recovery vessel to surround the substrate in this drying step, too. Also, it is desirable to supply a drying gas onto the substrate surface in this drying step.

Where the substrate to be processed is, for example, rectangular, it is desirable to move the process solution supply means along the shorter side of the substrate for supplying a process solution onto the substrate surface. In this case, the moving distance of the process solution supply means can be shortened. Also, the substrate can be processed uniformly and the processing time can be shortened.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 exemplifies a drying means of support pins;

FIG. 8 exemplifies a washing means for washing a rear surface of a substrate;

FIGS. 9A, 9B, 9C, 9D, 9E, 9F and 9G collectively show procedures of a processing method of the present invention;

FIG. 11 is a front view schematically showing the construction of a developing apparatus according to a second embodiment of the present invention;

DETAILED DESCRIPTION OF THE INVENTION

A suitable first embodiment of the present invention will now be described with reference to the accompanying drawings. The following description covers the case where a light-exposure pattern is formed on a rectangular LCD substrate using a coating-developing system employing the technical idea of the present invention. Of course, the technical idea of the present invention can also be applied to other substrates such as semiconductor wafers and can be employed in any other type of processing apparatus and method.

First of all, let us describe the entire construction of a coating-developing system to which the processing apparatus of the present invention can be applied.

Figure 2:
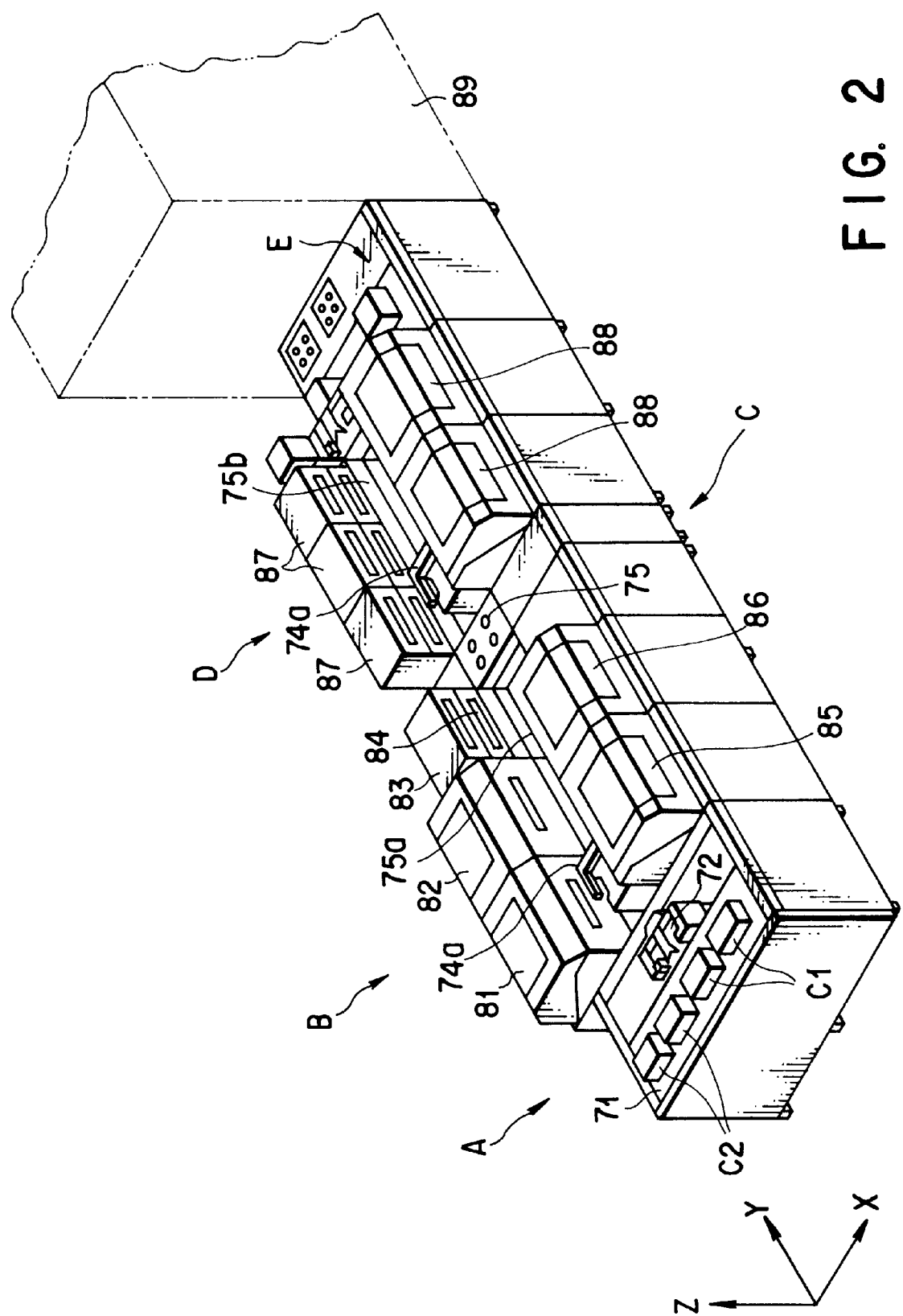
FIG. 2 shows an entire construction of a coating-developing system in which a processing apparatus of the present invention is employed.

Specifically, FIG. 2 shows the entire construction of a coating-developing system for an LCD substrate. Various pretreatments are applied to a substrate G in this system and, then, the substrate G is delivered from the system to an adjacent light-exposure apparatus 89 for exposure to light in a predetermined pattern. After the light-exposure treatment, the substrate G is transferred back to the coating-developing system for the developing and washing treatments.

The construction of the coating-developing system will be described more in detail. Specifically, the system comprises mainly a loader section A arranged on one side (left side in the drawing), for loading/unloading the substrate G, a first process section B, and a second process section D. Various treatments are applied to the substrate G in the first process section B including brush washing, jet water washing, adhesion treatment, cooling treatment, photo-resist treatment, and resist removing treatment. On the other hand, the second process section D, in which heat treatment, developing-washing treatment, etc. are 5performed, is arranged adjacent at one end to the first process section B with a relay section C interposed therebetween and adjacent at the other end to the light-exposure apparatus 89 with a delivery section E interposed therebetween.

Transfer arm mechanisms 74a, 74b for transferring the substrate G among process units 81 to 88 are arranged in the first and second process sections B and D, respectively. These transfer mechanisms 74a, 74b include arms movable both in a horizontal direction (X, Y-directions) and in a vertical direction (Z-direction), and swingable about a Z-axis.

The loader section A includes a cassette table 71 on which are arranged are a cassette C1 housing unprocessed substrates G and a cassette C2 housing processed substrates G, and a sub-arm mechanism 72 movable both in a horizontal direction (X, Y-directions) and in a vertical direction (Z-direction) for delivering the substrates G between the cassettes C1 and C2 arranged on the cassette table 71 and swingable by an angle θ about a vertical axis (Z-axis) to deliver and receive the substrates G to and from the transfer arm 74a in the first process section B.

The first process section B includes a brushing unit 81 for brush-washing the substrate G. a jet water washing unit 82 for washing the substrate G with a high pressure jet water, an adhesion unit 83 for making the substrate surface hydrophobic, a cooling unit 84 disposed below the adhesion unit 83 for cooling the substrate G to a predetermined temperature, a resist-coating unit 85 for coating the surface of the substrate G with a resist solution, and a resist-removing unit 86 for removing the resist from a peripheral portion of the substrate G. These brushing unit 81, jet water washing unit 82, adhesion unit 83, and cooling unit 84 are arranged on one side of the transfer path 75a, with the resist-coating unit 85 and the resist-removing unit 86 being arranged on the opposite side of the transfer path 75a.

The second process section D includes a heating unit 87 for heating the substrate G coated with a resist solution for the pre-baking or post-baking purpose, and a developing unit 88, which is a processing apparatus of the present invention. The heating unit 87 is arranged on one side of the transfer path 75b, with the developing unit 88 being arranged on the opposite side of the transfer path 75b.

In the coating-developing system of the construction described above, the unprocessed substrate G housed in the cassette C1 is taken out by the sub-arm mechanism 72 in the loader section A and, then, delivered to the transfer mechanism 74a in the first process section B. Further, the substrate G is loaded into the brushing unit 81. After the brush-washing in the brushing unit 81, the substrate G is dried. Alternatively, it is possible to wash the substrate G with a high pressure jet water within the jet water washing unit 82 depending on the process. Then, an adhesion treatment to make the substrate surface hydrophobic is applied to the substrate G within the adhesion unit 83, followed by cooling the substrate G within the cooling unit 84 and subsequently forming a photo-resist film, i.e., a photosensitive film, on the substrate surface within the resist-coating unit 85. Further, resist is removed from a peripheral portion of the substrate G in the resist-removing unit 86.

The substrate G having a resist film formed thereon is delivered via the relay section C to the transfer arm mechanism 74b in the second process section D. A baking treatment is applied to the substrate G within the heating unit 87 included in the second process section D. Then, the substrate G is delivered via the delivery section E into the light-exposure unit 89 for selective exposure to light to form a predetermined pattern. After the light-exposure, the substrate G is transferred into the developing unit 88 of the present invention. The substrate G is coated with a developing solution within the developing unit 88 for the developing purpose, followed by washing the substrate with a washing liquid to remove the residual developing solution so as to finish the developing treatment. The substrate G after the developing treatment is housed in the cassette C2 in the loader section A and, then, transferred from the cassette C2 to a next process step.

Figure 3:
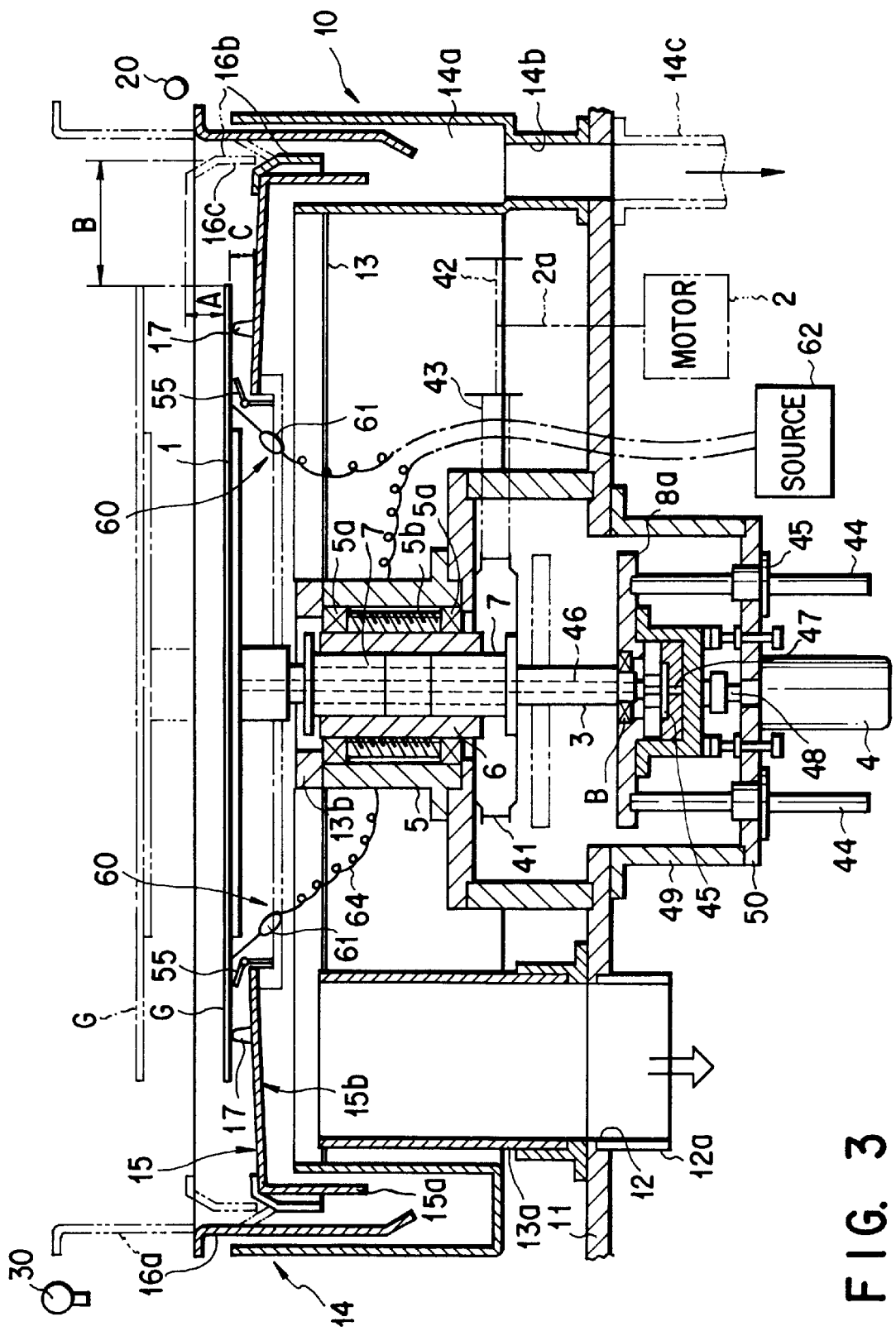
FIG. 3 is a cross sectional view showing a processing apparatus according to a first embodiment of the present invention.

FIG. 3 is a cross sectional view showing the construction of the developing unit 88 utilizing the technical idea of the present invention. As seen from the drawing, the developing unit 88 comprises a holding means, e.g., a spin chuck 1 connected to a vacuum pump, for holding the rectangular substrate G by vacuum suction, a lift means, e.g., a vertically movable cylinder 4, for vertically moving the spin chuck 1, a rotating means, e.g., a driving motor 2, for rotating the spin chuck 1 within a horizontal plane, a process vessel 10 arranged to surround the spin chuck 1, a developing solution supply nozzle 20 for supplying a developing solution, i.e., a process solution, onto the substrate G, and an after-treating liquid supply nozzle 30 for supplying an after-treating liquid such as a deionized water or pure water onto the substrate G.

A rectangular substrate G having a maximum size of, for example, 500 mm×400 mm, can be held by vacuum suction on the surface of the spin chuck 1. Incidentally, a spin chuck capable of holding a large rectangular substrate sized at 650 mm×830 mm or 730 mm×860 mm, has been developed recently.

The spin chuck 1 includes a rotary shaft 3 having a fluid passageway 46 formed therein. The fluid passageway 46 is connected to a vacuum pump (not shown). If the vacuum pump is operated, the substrate G is held by vacuum suction on the spin chuck 1.

A spline bearing 7 is fitted over the rotary shaft 3 rotatably supporting the spin chuck 1. A belt 43 is stretched between a driven pulley 41 mounted to the spline bearing 7 and a pulley 42 mounted to a rotary shaft 2a of a driving motor 2. If the driving motor 2 is operated, the rotation of the rotary shaft 2a of the motor 2 is transmitted to the spline bearing 7 via the pulley 42, the belt 43, and the driven pulley 41 so as to rotate the rotary shaft 3.

The spline bearing 7 is fitted in the inner circumferential surface of a rotatable inner cylinder 6 which is rotatably mounted via a bearing 5a and a labyrinth seal 5b to the inner circumferential surface of a stationary collar 5 arranged within the process vessel 10.

The lower end portion of the rotary shaft 3 is positioned in a lower portion of the process vessel 10, and the lift means of the vertically movable cylinder 4 is arranged to face the lower end portion of the rotary shaft 3. The cylinder 4 is mounted to a vertical driving chamber 49 fixed to a base 11. Also, a movable collar 8 which is joined to the lower end portion of the rotary shaft 3 is mounted to a vertically movable piston rod 48 of the cylinder 4. Slide shafts 44, 44 are mounted to a flange portion 8a of the movable collar 8. If these slide shafts 45, 45 are inserted through guide portions 45, 45 formed in the driving chamber 49, the movable collar 8 is smoothly moved in a vertical direction.

The process vessel 10 comprises an exhaust passageway 13a communicating with an exhaust port 12 formed in the base portion 11, a lower vessel 13 including a mounting hole 13b of the stationary collar 5 mounted to the base portion 11, a vessel base portion 14 surrounding the outer surface of the lower vessel 13 and including a circumferential groove 14a whose bottom plane is inclined, an inner vessel 15 including an inclined plate 15b inclined upward from the upper end of a hanging piece 15a hanging into the circumferential groove 14a of the vessel base portion 14 toward the rear surface of the substrate G held by the spin chuck 1, a first cylindrical outer vessel 16a surrounding the circumferential outer surface of the inner vessel 15 and driven by a lift means (not shown) in a vertical direction so as to be pushed into or pulled out of the circumferential groove 14a of the vessel base portion 14, and a second cylindrical outer vessel 16b which can be moved upward outside the inner vessel 15 by elevation of the first outer vessel 16a.

The exhaust port 12 and the exhaust passageway 13a are formed in a plurality of portions, e.g., two concentric portions, though each of these exhaust port 12 and the exhaust passageway 13a is shown in only one portion in FIG. 3. Also, an exhaust pipe 12a, to which is connected an exhaust device (not shown), is connected to the exhaust pipe 12. Further, a waste liquid discharge port 14b connected to a waste liquid pipe 14c is formed in the lowermost bottom portion of the circumferential groove 14a of the vessel base portion 14. It is possible to increase the number of exhaust pipes 12a and exhaust passageways 13a depending on the size of the substrate G. That is, these pipe 12a and passageway 13a can be formed in 4, 6 or more portions.

In coating a front surface of the substrate G with a developing solution within the process vessel 10, it is necessary to suck the inner atmosphere of the process vessel 10 so as to prevent the developing solution from being scattered and attached again to the substrate G. In this case, it is necessary to take measures for preventing occurrence of turbulence around the substrate G. In the embodiment shown in the drawing, distance A between the surface of the substrate G and the open end of the second outer vessel 16b is set at 10 to 20 mm. Also, distance B between the longer side of the substrate G and a side wall 16c of the second outer vessel 16b is set at 15 to 75 mm. Further, distance C between the rear surface of the substrate G and the tip of the inclined plate 15b of the second outer vessel 15 is set at 10 to 25 mm. Incidentally, distance A noted above can be set optionally, e.g., 100 to 250 mm.

For loading the substrate G into the process vessel 10 of the construction described above, the spin chuck 1 is moved upward, with the first outer vessel 16a and the second outer vessel 16b shown in FIG. 2 held in the lower positions. Then, the substrate G transferred by a transfer arm (not shown) is disposed on the spin chuck 1 so as to be held by vacuum suction, followed by moving downward the spin chuck 1 to load the substrate G in the process vessel 10.

Further, the first and second outer vessels 16a, 16b are moved upward for application of a developing treatment to the substrate G.

Figure 1:
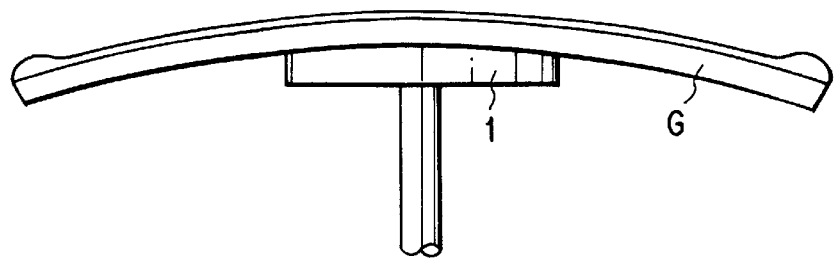
FIG. 1 shows a problem inherent in the prior art, which is to be solved by the present invention.
Figure 4:
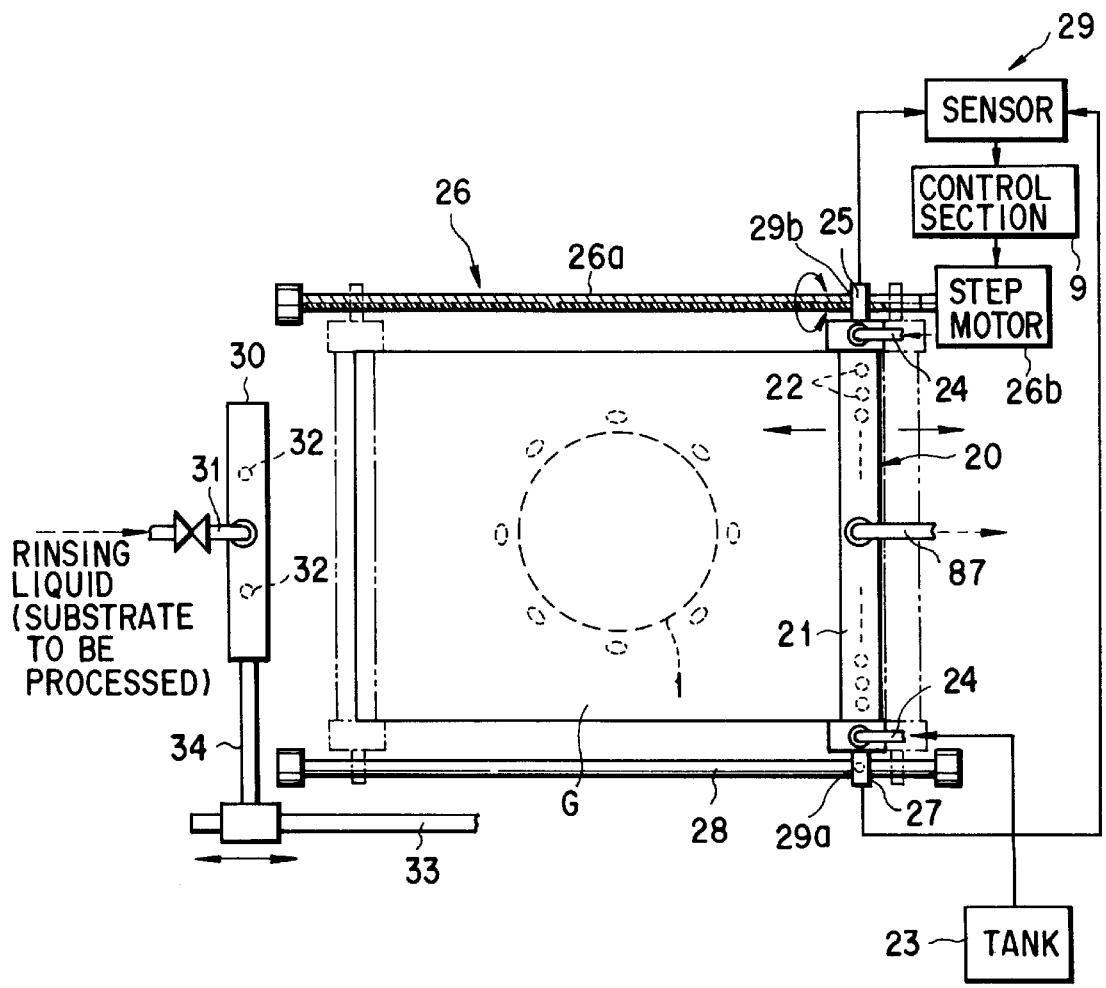
FIG. 4 is a plan view exemplifying a process solution supply means and a moving mechanism of the process solution supply means.

FIG. 4 shows that the developing solution supply nozzle 20 comprises a cylindrical container 21 of a developing solution and a series of fine holes 22 equidistantly arranged in a longitudinal direction of the container 21. The container 21 consists of, for example, a polyvinyl chloride pipe longer than the shorter side of the substrate G and closed at both ends. A developing solution supply pipe 24, which is connected at one end to a developing solution tank 23 housing a developing solution, i.e., a process solution, is connected at the other end to both end portions of the developing solution container 21 of the nozzle 20. A compressed nitrogen gas ($N_2$) is introduced into the tank 23 to permit the developing solution to be supplied into the supply nozzle 20, with the result that the developing solution oozes through the fine holes 22 in the shape of a curtain onto the surface of the substrate G. Also, a support arm 25 protrudes onto one end of the developing solution container 21. A moving shaft 26a, which is formed of a ball screw, of a moving means 26 is engaged with the support arm 25. The moving shaft 26a is rotated both in the clockwise and counterclockwise directions by, for example, a step motor 26b so as to move the developing solution supply nozzle 20 along the longer side of the substrate G. It is possible to use, for example, a servo motor in place of the step motor 26b.

A guide arm 27, which protrudes outward from the other end of the developing solution supply nozzle 20, is slidably mounted to a guide rail 28 extending in parallel with the moving shaft 26a so as to allow the developing solution supply nozzle 20 to be moved smoothly. In this case, the rotating direction and rotating time of the step motor 26b are determined by a signal supplied from a control section 9 to allow the nozzle 20 to be arranged in the vicinity of an edge of the longer side of the substrate G. Then, the step motor 26a is rotated in the reverse direction to move the nozzle 20 toward the other edge of the substrate G.

It is desirable to mount an optical sensor 29 consisting of a light-emitting portion 29a and a light receiving portion 29b to each of the support arm 25 and the guide arm 27 of the developing solution supply nozzle 20, as shown in FIG. 4. In this case, movement of the nozzle 20 to the edge portion of the substrate G can be detected by the sensor 29 and can be stopped by supplying a detection signal to the control section 9.

A rinsing liquid supply pipe 31 is connected to a front portion of the after-treating liquid supply nozzle 30. Also, after-treating liquid spurting ports 32 are formed in a rear portion of the nozzle 30. The process solution supply nozzle 30 can be moved by a moving arm 34 movable along a transfer rail 33 arranged in parallel with the movable shaft 26a and with the guide rail 28 to a position above the substrate G held by the spin chuck 1.

In the embodiment shown in the drawing, an after-treating liquid is supplied while the spin chuck 1 moved to its upper position is rotated. Therefore, the nozzle 30 is positioned higher than the developing solution supply nozzle 20, as shown in FIG. 3.

In the present invention, an overhanging portion of the substrate G extending over an edge of the spin chuck 1 is supported by a support means. In this embodiment, the support means is formed of a plurality of support pins 17, e.g., four support pins 17, extending upright from the inclined plate 15b, which is a stationary portion, of the inner vessel 15. The support pin 17 is formed of a material which does not do damage to the rear surface of the substrate G. For example, the pin 17 is formed of resin, rubber or a soft metal such as brass or aluminum. Also, the pin 17 is shaped not to do damage to the rear surface of the substrate G. For example, the tip portion of the pin 17 is made hemispherical. The tip portion of the pin 17, which supports the overhanging end portion of the substrate G held by the spin chuck 1, is positioned flush wish the upper surface of the spin chuck 1. It follows that the surface of the substrate G held by both the spin chuck 1 and the pins 17 is kept horizontal.

The bending degree of the overhanging portion of the substrate G held by the spin chuck 1 is proportional to the distance from the spin chuck 1. Naturally, the largest bending occurs at the peripheral portion remotest from the spin chuck 1 of the substrate G. In this sense, it is desirable to mount the support pins along the periphery of the substrate G. However, since bending also occurs between adjacent support pins 17 and between the support pin 17 and an edge of the spin chuck 1, it is desirable to mount the support pins 17 equidistantly in a region somewhat inward of the periphery of the substrate G, though it is of course possible to mount the support pins 17 elsewhere.

Figure 6:
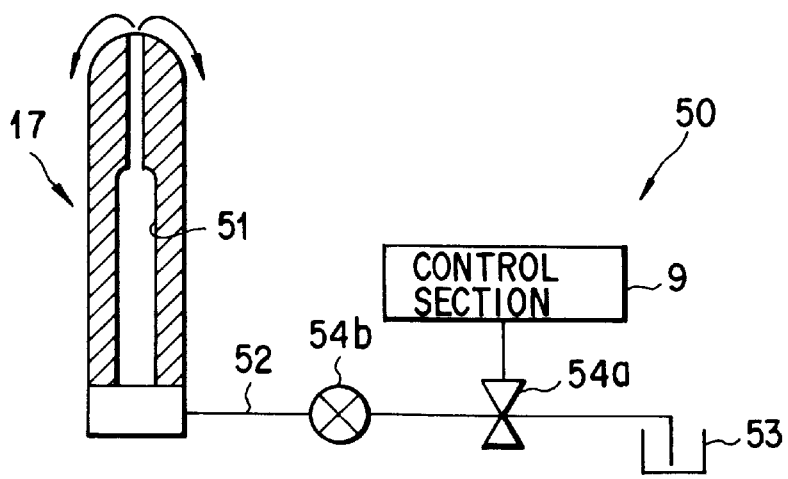
FIG. 6 exemplifies a washing means of support pins.
Figure 10A:
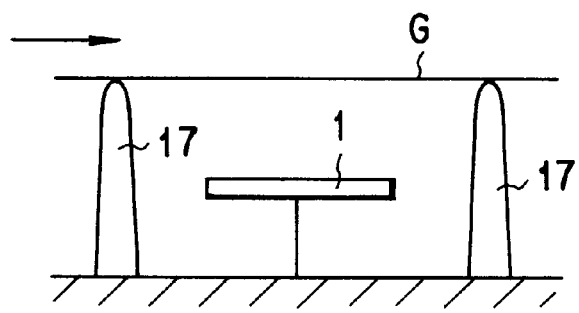
FIGS. 10A, 10B, 10C and 10D collectively show procedures of another processing method of the present invention.
Figure 10B:
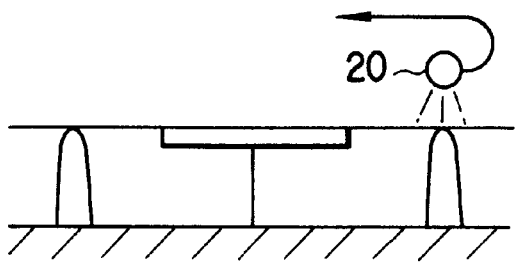
Figure 10C:
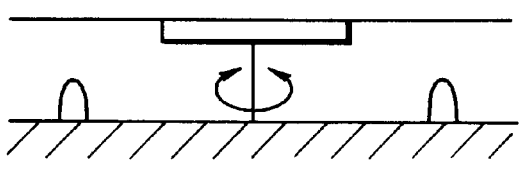
Figure 10D:
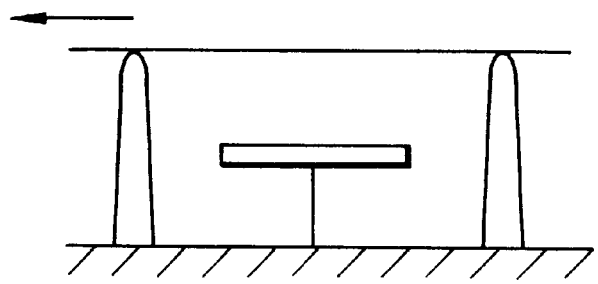

The developing solution attached to the substrate G is centrifugally removed for drying the substrate G in the subsequent step, as will be described herein later. If the developing solution is attached to the support pin 17 in this drying step, the developing solution may possibly be attached to the rear surface of the substrate G. Therefore, a washing means 50 for washing the support pin 17 in the step of centrifugally drying the substrate G is mounted in this embodiment, as shown in FIG. 6. The washing means 50 comprises a washing liquid passageway 51 extending from a base portion to reach a tip portion of the support pin 17, a washing liquid supply section 53 for supplying a washing liquid to the support pin 17 through a washing liquid supply pipe 52, a change-over valve 54a mounted to the washing liquid supply pipe 52 and changed-over by a control signal supplied from the control section 9, and a flow rate control valve 54b for controlling the flow rate of the washing liquid flowing outward through the tip portion of the support pin 17.

The control section 9 permits the substrate G to be rotated for centrifugally separating, for example, a developing solution for drying the substrate G and, at the same time, permits operating the change-over valve 54a so as to cause the washing liquid to flow outward through the tip portion of the support pin 17. Then, rotation of the substrate G is stopped, and the change-over valve 54a is changed-over in the reverse direction so as to stop outflow of the washing liquid through the tip portion of the support pin 17.

Since the washing liquid passageway 51 is open at the tip of the support pin 17, the washing liquid flows outward through the tip portion of the support pin 17 and, then, flows downward along the outer circumferential surface of the support pin 17 so as to wash the entire outer surface of the support pin 17. It follows that, even if the developing solution is centrifugally separated by rotating the substrate G, the washing liquid flowing outward through the tip portion of the support pin 17 prevents the developing solution from being attached to the support pin 17. Naturally, it is impossible for the developing solution to be attached to the rear surface of a new substrate G which is to be processed.

Figure 5:
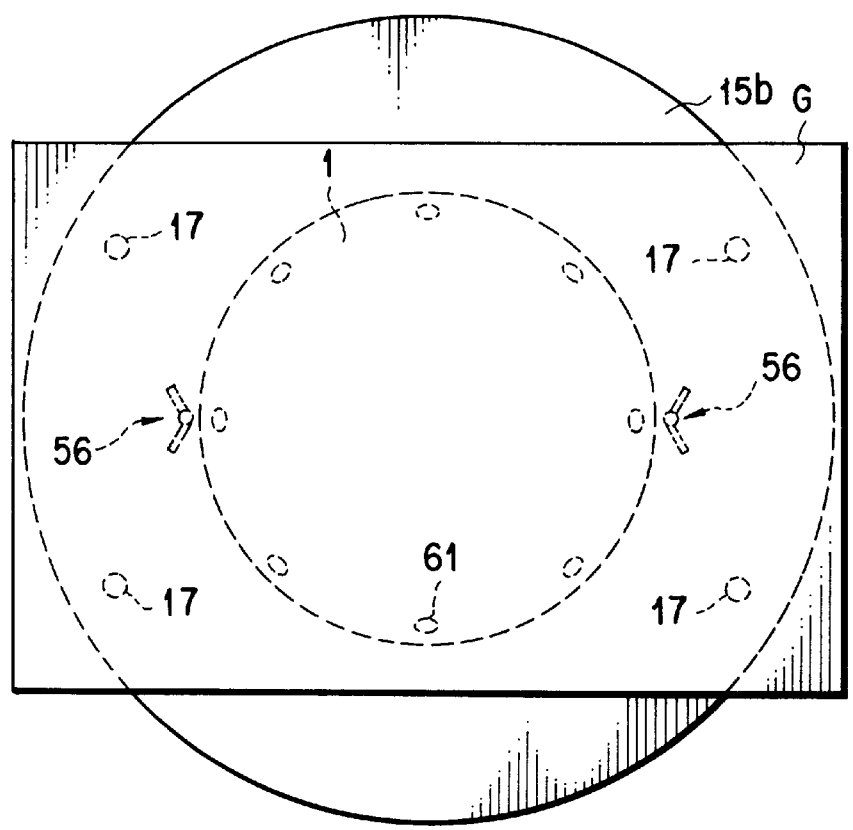
FIG. 5 is a plan view showing an arrangement of support pins.

It should also be noted that, if the next substrate G is processed after washing of the support pin 17, with the support pin 17 left to stand as it is, the washing liquid remaining at the tip portion of the support pin 17 is attached to the rear surface of the substrate G so as to bring about a so-called "water mark". To overcome this difficulty, a drying means 55 for blowing a drying gas against the support pin 17 after the washing liquid ceased to flow outward is arranged in this embodiment as shown in FIGS. 3, 5 and 7. As shown in FIG. 7, the drying means 55 comprises a nozzle 56 for blowing an inert gas such as a nitrogen gas ($N_2$) or an argon gas (Ar) against the support pin 17, an inert gas supply source 57 such as a gas tank, a supply pipe 59 for supplying the inert gas from the inert gas supply source 57 to the nozzle 56, and a switching valve 58 mounted to the supply pipe 59. Upon receipt of a control signal supplied from the control section 9, the switching valve 58 is opened or closed so as to supply or stop supplying the inert gas. The nozzle 56 is directed toward the tip portion of the support pin 17 so as to blow the inert gas against the tip portion of the support pin 17.

In the embodiment shown in FIG. 5, a branched nozzle 56 having two gas spurting ports is arranged at two portions. However, it is possible to mount the nozzle 56 for each of the support pins 17.

Let us describe the washing means for washing the rear surface of the substrate G by spurting a washing liquid against the rear surface of the substrate G so as to prevent the developing solution from being attached to the substrate rear surface.

In the present invention, the developing solution coated on the front surface of the substrate G is centrifugally removed by rotating the substrate G. The developing solution scattered in this step tends to be partly attached to the rear surface of the substrate G. To overcome this difficulty, a washing liquid spurting means 60 is mounted in this embodiment as shown in FIG. 3. After rotation of the substrate G for centrifugally removing the developing solution, the developing solution is washed away by supply of a washing liquid and, at the same time, the washing liquid is spurted from the spurting means 60 against the rear surface of the substrate G.

As shown in FIG. 8, the washing liquid spurting means 60 comprises a washing liquid spurting nozzle 61 arranged below the substrate G held by the spin chuck 1, a washing liquid supply source 62 for supplying the washing liquid to the nozzle 61 through a washing liquid supply pipe 64, and a switching valve 63 mounted to the supply pipe 64. The valve 63 is opened or closed by a control signal supplied from the control section 9. A plurality of nozzles 61, e.g., 8 nozzles 61, are equidistantly mounted along the periphery of the spin chuck 1, as shown in FIG. 5. Where the washing liquid is substantially equal to the after-treating liquid, the washing liquid supply source 62 for supplying a washing liquid to the nozzle 61 may be the same as the after-treating liquid supply source for supplying an after-treating liquid to the after-treating liquid supply nozzle 30. Also, it is possible to arrange stationary the washing liquid spurting nozzles 61 with the spurting angles to the substrate G made different from each other. Alternatively, it is possible to arrange a nozzle angle adjusting mechanism (not shown) to make the spurting angle of the nozzle 61 variable.

FIGS. 9A to 9G collectively show the processing procedures of the substrate G performed by the developing unit 88 of the present invention.

As shown in FIG. 9A, the substrate G loaded in the developing unit 88 by the transfer arm mechanism 74b is disposed on the spin chuck 1 moved upward by the vertically movable cylinder 4 so as to be held by vacuum suction by the spin chuck 1. Then, the cylinder 4 is driven to move the spin chuck 1 downward. As a result, the overhanging portion of the substrate G extending over an edge of the spin chuck 1 is supported by the support pins 17 so as to permit the substrate G to be held horizontal, as shown in FIG. 9B. Under this condition, the developing solution supply nozzle 20 is arranged above the substrate G to face the overhanging portion including one shorter side of the substrate G such that the fine holes 22 of the nozzle 20 are positioned about 5 mm inward of the shorter side of the substrate G. Then, the nozzle 20 is moved to one end of the substrate G while supplying a developing solution onto the substrate G, thereby coating the front surface of the substrate G with the developing solution.

After the entire front surface of the substrate G is coated with the developing solution by moving the nozzle 20 to the other end of the substrate G, the nozzle 20 stops its supply of the developing solution and is held in its position in preparation for the next coating operation, or is brought back to the original waiting position, as shown in FIG. 9C.

Then, the spin chuck 1 is moved upward to move the substrate G away from the support pins 17, followed by rotating the spin chuck 1 at, for example, 10 rpm for about 3 seconds so as to centrifugally spread outward the developing solution coated on the substrate G. Then, the spin chuck 1 is continuously rotated at about 200 rpm so as to uniformly spread the developing solution. In this step, the washing liquid is kept flowing from the tip portion of the support pin 17 so as to prevent the developing solution from being attached to the support pin 17, as shown in FIG. 9D.

In the next step, the after-treating liquid supply nozzle 30 is moved to a position above the substrate G so as to supply a washing liquid to the substrate G while keeping the substrate G rotated and, thus, to stop the development. At the same time, a washing liquid is spurted from the washing liquid spurting nozzle 60 toward the rear surface of the substrate G so as to wash away the developing solution attached to the rear surface of the substrate G, as shown in FIG. 9E.

Then, the substrate G is rotated for a predetermined time for centrifugally removing the washing liquid after stopping the supply of the washing liquid from the after-treating liquid supply nozzle 30 and also stopping, at the same time, the spurting of the washing liquid from the washing liquid spurting nozzle 60. In this step, flow of the washing liquid from the tip portion of the support pin 17 is stopped, and a drying gas is blown from the blowing nozzle 56 toward the support pin 17 for drying the support pin 17, as shown in FIG. 9F.

After completion of the operations described above, the substrate G is detached from the spin chuck 1 and, then, unloaded from the developing unit 88 by the transfer arm mechanism 74a, as shown in FIG. 9G. Further, the next substrate G is loaded in the developing unit 88 by the transfer arm mechanism 74a, and the procedures described above are repeated.

The present invention is not limited to the preferred embodiment described above. For example, in the embodiment described above, the support pin 17 is fixed to a stationary member (inclined plate 15b) of the developing unit 88, and the spin chuck 1 is vertically moved upward by the vertically movable cylinder 4. Alternatively, it is possible to make the support pins 17 vertically movable while making the spin chuck 1 immovable in a vertical direction, though the spin chuck 1 is left rotatable, as shown in FIGS. 10A to 10D. This modification is effective for suppressing the bending of the substrate G because the substrate G is kept in contact with the support pins 17 until the support pins 17 supporting the substrate G are moved downward to permit the substrate G to be disposed on the spin chuck 1 which is to be rotated. In other words, it is possible to shorten the waiting time of the substrate G in a bent state.

The technical idea of the present invention is applied to a developing unit in the embodiment described above. However, the particular technical idea can also be applied to other process units such as a resist coating unit or a washing unit. Where the technical idea of the present invention is applied to, for example, a washing unit, a support means for horizontally supporting a substrate to be processed can be used in the step of brush-washing the substrate.

Further, the substrate to be processed need not be limited to LCD substrates. In other words, the technical idea of the present invention can be employed for the processing of various other substrates such as a semiconductor wafer, a glass substrate, a CD substrate, a photo mask, a printed circuit substrate and a ceramic substrate.

Figure 12:
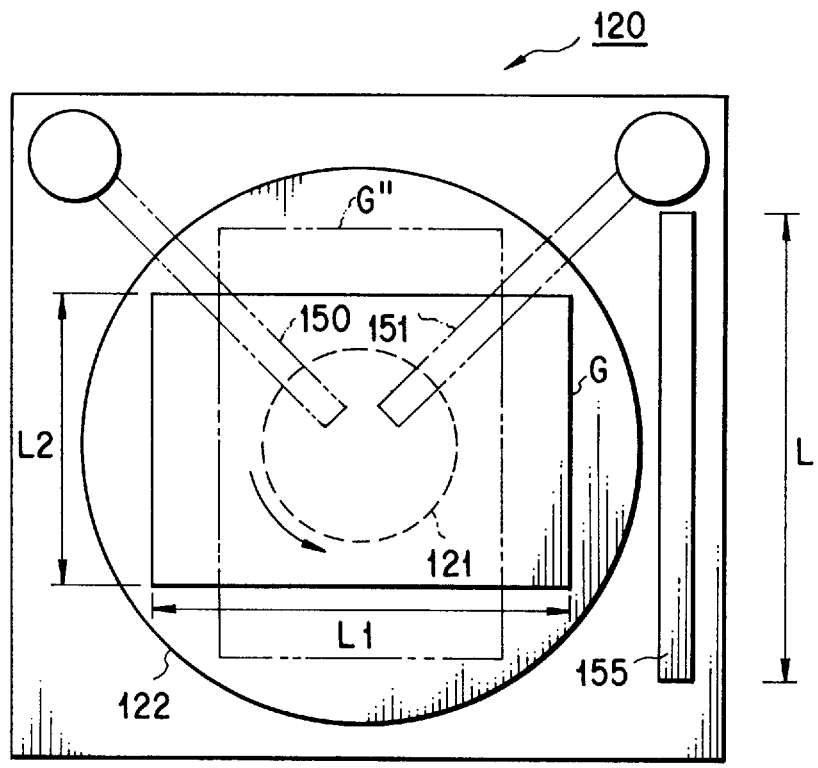
FIG. 12 is a plan view of the developing apparatus shown in FIG. 11.

Let us describe a second embodiment of the present invention, covering a case where a developing unit 120 shown in FIGS. 11 and 12 is incorporated in the process system shown in FIG. 2. Specifically, FIGS. 11 and 12 are a front view and a plan view, respectively, schematically showing the construction of the developing unit 120. As shown in these drawings, the developing unit 120 comprises a spin chuck 121 for holding the substrate G by vacuum suction and rotating the substrate G and a cylindrical cup 122 open at the upper end and arranged to surround the spin chuck 121 holding the substrate G. As shown in FIG. 12, the substrate G, which is rectangular, has a longer side $L_1$ and a shorter side $L_2$. The spin chuck 121 is supported by the upper end of a rotary shaft 126 of a motor 125 and, thus, is rotated by the operation of the motor 125 so as to rotate the substrate G. The motor 125 is controlled by a control means 127 such that the rotation amount and the rotating speed of the substrate G are set optionally.

The cup 122 surrounding the spin chuck 121 holding the substrate G is supported movable in a vertical direction. Specifically, a piston rod 131 of a vertically movable cylinder 130 is joined via a bracket 132 to the outer surface of the cup 122, with the result that the cup 122 is moved vertically in accordance with elongation/shrinkage of the cylinder 130. The operation of the vertically movable cylinder 130 is controlled by the control means 127 referred to previously.

An inclined wall 133 inclining inward is formed at the upper end of the cup 122. Also, a ring wall 134 inclining inward is formed along the inner circumferential surface of the cup 122 to form an annular structure partitioning the inner space of the cup 122 into an upper and a lower region. The resultant lower region constitutes a recovery vessel 135 positioned to surround the substrate G in the subsequent step of recovering the developing solution from the substrate surface. Also, the resultant upper region defined between the inclined wall 133 and the ring wall 134 constitutes a casing cover 136 which is positioned to surround the substrate G in the subsequent steps of washing and drying the substrate G. When the cup 122 is moved downward by shrinking the vertically movable cylinder 130, the ring wall is positioned lower than the substrate G held by the spin chuck 121 as denoted by solid lines 134 in FIG. 11, with the result that the casing cover 136 is positioned to surround the substrate G. On the other hand, when the cylinder 130 is elongated to move upward the cup 122, the ring wall is positioned higher than the substrate G held by the spin chuck 121 as denoted by broken lines 134'. As a result, the recovery vessel 135 is positioned to surround the substrate G.

An annular outer wall 141 and a partition wall 142 arranged a predetermined distance inward of the outer wall 141 are mounted to a bottom wall 140 of the cup 122. The atmosphere within the casing cover 136 communicates with the space between the outer wall 141 and the partition wall 142. Also, the atmosphere within the recovery vessel 135 communicates with the space inside the partition wall 142. Waste liquid discharge ports 143 and 144 are formed through the bottom wall 140 of the cup 122. The port 143 is positioned to communicate with the space between the outer wall 141 and the partition wall 142, with the port 144 positioned to communicate with the space inside the partition wall 142. Further, a plurality of rear surface washing nozzles 145 are arranged in a central portion of the bottom wall 140 of the cup 122 for spurting a washing liquid, e.g., pure water, toward the rear surface of the substrate G held by vacuum suction on the spin chuck 121.

Further, a washing liquid supply nozzle 150 and a drying gas supply nozzle 151 are arranged above the substrate G held by the spin chuck 121. A washing liquid, e.g., pure water, is spurted from the nozzle 150 toward a central portion on the front surface of the substrate G. On the other hand, an inert gas such as a $N_2$ gas used as a drying gas is spurted from the drying gas spurting nozzle 151 toward a central portion on the front surface of the substrate G. The operation of these nozzles 150 and 151 is also controlled by the control means 127.

Figure 13:
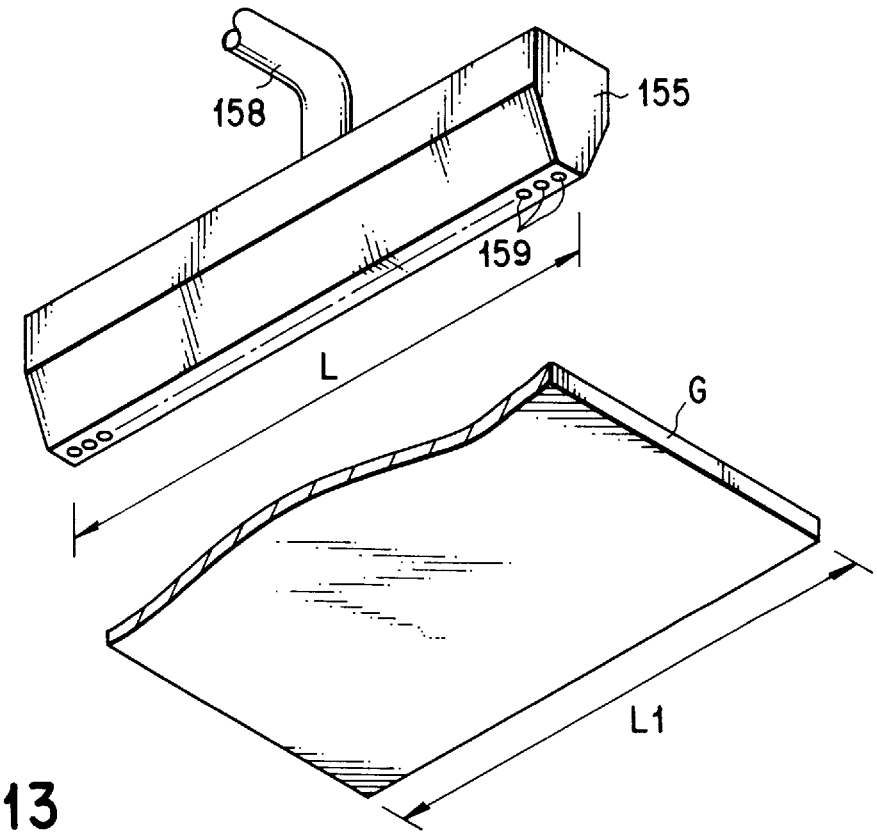
FIG. 13 is an oblique view of a process solution supply nozzle.

A developing solution supply nozzle 155 is arranged upward and sideward (right side in FIGS. 11 and 12) of the cup 122 to supply a developing solution (process solution) onto the front surface of the substrate G held by the spin chuck 121. The nozzle 155 can be moved over and across the cup 122 by a driving mechanism (not shown). A liquid supply pipe 158 for supplying a developing solution stored in a tank 156 by operating a pump 157 is connected to the developing solution supply nozzle 155. As shown in FIG. 13, a large number of discharge ports 159 of the developing solution are linearly arranged at a high density over the entire width of the lower surface of the developing solution supply nozzle 155. When the pump 157 is operated to permit the developing solution housed in the tank 156 to be supplied through the pipe 158 to the nozzle 155, the developing solution is discharged from these discharge ports 159. Since these discharge ports 159 are positioned very close to each other, no clearance is formed between adjacent streams of the developing solution discharged from these discharge ports 159, with the result that the developing solution is discharged from these discharge ports 159 in the form of a film. The pump 157 is also controlled by the control means 127 so as to set optionally the timing of discharging the developing solution.

The length L of the developing solution supply nozzle 155 is set larger than the length $L_1$ of the longer side of the substrate G ($L>L_1$). Therefore, the developing solution can be supplied uniformly over the entire front surface of the substrate G, if the developing solution supply nozzle 155 is moved over and across the cup 122 while discharging the developing solution to form a film from the large number of discharge ports 159 of the nozzle 155.

As shown in FIG. 11, a recovery pipe 160 for bringing the developing solution recovered in the recovery vessel 135 from the surface of the substrate G back to the developing solution tank 156 is connected between the tank 156 and the waste liquid discharge port 144. A regenerating means 161 for regenerating the developing solution recovered in the recovery vessel 135 is mounted to the recovery pipe 160. The regenerating means 161 comprises a gas-liquid separating mechanism 162 for removing bubbles from the recovered developing solution and a filter 163 for removing the impurities from the developing solution.

Figure 14:
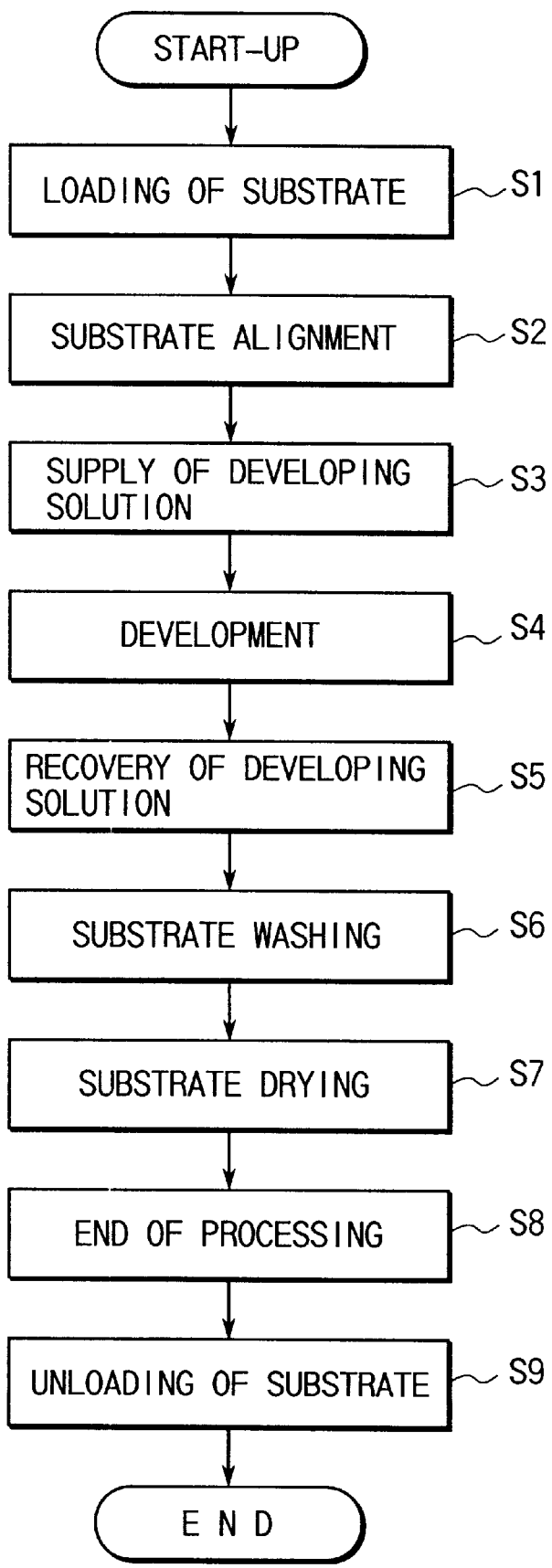
FIG. 14 is a flow chart showing the process steps in the second embodiment of the present invention.

FIG. 14 is a flow chart showing the process steps of the developing unit 120. In the first step S1, the main arm 74a of the process system shown in FIG. 2 is moved into the developing unit 120 to load the substrate G in the developing unit 120. In this step, the substrate G is firmly held by vacuum suction by the spin chuck 121. Then, the main arm 74a is moved out of the developing unit 120.

In the next step, the substrate G held by the spin chuck 121 is rotated by a desired angle by suitably operating the motor 125 under control of the control means 127 so as to permit the longer side of the substrate G to be in parallel with the developing solution supply nozzle 155, as denoted by a broken line G" in FIG. 12 (step S2).

After the substrate alignment in step S2, the developing solution supply nozzle 155 is moved over and across the cup 122 by a driving mechanism (not shown). During the movement of the nozzle 155, a developing solution is discharged in the form of a film from the many discharge ports 159 of the nozzle 155 so as to supply the developing solution over the entire front surface of the substrate G (step S3). The developing solution is kept supplied to the substrate front surface for a predetermined period of time so as to perform the developing treatment on the front surface of the substrate G (step S4).

As already described, the substrate G is aligned in step S2 to permit the longer side of the substrate G to be in parallel with the developing solution supply nozzle 155. Therefore, the developing solution supply nozzle 155 is moved along the shorter side of the substrate G in step S3 for supplying the developing solution to the front surface of the substrate G. It follows that it suffices to control the discharge timing of the developing solution such that the developing solution is discharged from the nozzle 55 while the nozzle 55 is moving along the shorter side of the substrate G. The control means 127 controls the operation of the pump 157 so as to control the discharge timing of the developing solution.

As described previously, the length L of the developing solution supply nozzle 155 is larger than the length $L_1$ of the longer side of the substrate G. Therefore, if the developing solution is discharged from the nozzle 155, which is once moved to a region above the substrate G, the developing solution discharged in the form of a film can be supplied uniformly over the entire front surface of the substrate G. What should be noted is that it suffices to discharge the developing solution from the discharge ports 159 only during movement of the nozzle 155 over the length $L_2$ of the shorter side of the substrate G, making it possible to shorten the supply time of the developing solution and to make the developing treatment uniform. It is also possible to shorten the moving distance of the developing solution supply nozzle 155 so as to shorten the time for the developing treatment.

Suppose the developing solution supply nozzle 155 is moved for supplying the developing solution under the condition that the longer side of the substrate G is perpendicular to the nozzle 155 as denoted by a solid line G in FIG. 12. In this case, the nozzle 155 is moved along the longer side of the substrate G, with the result that the developing solution must be kept discharged from the discharge ports 159 during movement of the nozzle 155 over the length $L_1$ of the longer side of the substrate G. With increase in the moving distance of the developing solution supply nozzle 155, the developing solution supply time is also increased. It follows that the front surface of the substrate G is rendered non-uniform in the contact time with the developing solution. To be more specific, the contact time is made longer in the portion where the developing solution is supplied earlier, and is made shorter in the portion where the developing solution is supplied later. As a result, it is difficult to perform the developing treatment uniformly. Where, for example, a pattern is formed on a glass substrate for liquid crystal display, the non-uniformity in the contact time with the developing solution causes the line width characteristics on the front surface of the substrate G to be deteriorated, with the result that thick and thin portions are brought about in the developed pattern. It may be conceivable to increase the moving speed of the developing solution supply nozzle 155 in order to make the contact time with the developing solution uniform over the entire front surface of the substrate G. In this case, however, it is difficult to supply uniformly the developing solution discharged from the nozzle 155 in the form of a film over the entire front surface of the substrate G, resulting in failure to form a solution layer of a uniform thickness on the substrate surface, said solution layer being formed by surface tension of the solution. Further, if the developing solution supply nozzle 155 is moved along the longer side of the substrate G, the moving distance of the nozzle 155 is increased, making it difficult to shorten the time for the developing treatment.

In the second embodiment of the present invention, however, the developing solution supply nozzle 155 is moved along the shorter side of the substrate G, making it possible to shorten markedly the developing solution supply time, compared with the case where the nozzle 155 is moved along the longer side of the substrate G. Also, the contact time with the developing solution is made substantially uniform over the entire front surface of the substrate G in the second embodiment, with the result that the developing treatment is rendered uniform to make the line width characteristics uniform on the front surface of the substrate G. Further, since the moving distance of the developing solution supply nozzle 155 is shortened, the treating time is also shortened.

After completion of the developing treatment, the vertically movable cylinder 130 shown in FIG. 11 is elongated to move the cup 122 upward. As a result, the ring wall 134 is moved upward to a position above the substrate G held by the spin chuck 121 as denoted by broken lines 134' to permit the recovery vessel 135 to surround the substrate G. Then, a washing liquid, e.g., pure water, begins to be supplied from the washing liquid supply nozzle 150 positioned above the cup 122 toward a central portion on the front surface of the substrate G. Also, the motor 125 is operated under control by the control means 127 to rotate the substrate G held by the spin chuck 121 at a first rotation speed. As a result, the developing solution forming an upheaved layer by surface tension on the substrate G is centrifugally removed from the substrate G so as to be recovered in the recovery vessel 135 (step S5). It should be noted that the recovery vessel 135 receives the developing solution the concentration of which is not markedly reduced.

The first rotation speed of the substrate G in step S5 can be set at, for example, 50 to 150 rpm. In this case, substantially all the developing solution can be centrifugally removed from the substrate G in such a short time as about 1 to 3 seconds so as to be recovered in the recovery vessel 135. Since a washing liquid is not appreciably mixed in the developing solution recovered in the recovery vessel 135, the recovered developing solution has a sufficiently high concentration. The recovered developing solution is supplied through the recovery pipe 160 connected to the waste liquid discharge port 144 to the regenerating means 161 for removing bubbles from the recovered solution and, then, filtering the solution. Further, the filtrate is brought back to the tank 156. Since the developing solution recovered in the recovery vessel 135 can be brought back to the tank 156 without adjusting the concentration of the solution, the recovered developing solution can be reused easily.

Even after recovery of the developing solution in step S5, the washing liquid of pure water is kept supplied from the washing liquid supply nozzle 150 positioned above the cup 122 onto a central portion of the substrate G. Then, the rotation speed of the motor 125 is changed by the control means 127 so as to rotate the substrate G held on the spin chuck 121 at a second rotation speed. What should be noted is that the washing liquid, which is kept supplied onto the central portion of the substrate G, is centrifugally moved toward the periphery and, then, removed from the substrate G, with the result that the substrate G is washed with the washing liquid (step S6).

The second rotation speed of the substrate G in step S6 is set at, for example, 100 to 200 rpm. In this case, the substrate G can be washed in about 18 seconds. Also, the vertically movable cylinder 130 is shrunk in step S6 to move the cup 122 downward. As a result, the ring wall is moved downward to a position below the substrate G held on the spin chuck 121 as denoted by solid lines 134 in FIG. 11 so as to permit the casing cover 136 to be positioned to surround the substrate G. Also, the washing liquid centrifugally removed from the substrate G is received by the casing cover 136. Then, the received washing liquid is discharged to the outside through the waste liquid discharge port 143 formed through the bottom wall 140 of the cup 122.

In step S6, the rear surface of the substrate G is also washed with a washing liquid of, for example, pure water supplied from the rear surface washing nozzle 145 shown in FIG. 11 toward the rear surface of the substrate G. The washing liquid used for washing the rear surface is also centrifugally removed from the substrate G so as to be received by the casing cover 136 and, then, discharged to the outside through the waste liquid discharge port 143.

After the substrate G is rotated at the second rotation speed for about 18 seconds for centrifugally removing the developing solution in step S6, the washing liquid supply from the nozzle 150 positioned above the cup 122 is stopped, followed by starting the supply of an inert gas such as a $N_2$ gas from the drying gas supply nozzle 151 positioned above the cup 122 toward the central portion on the front surface of the substrate G. Also, the rotating speed of the motor 125 is changed under control by the control means 127 so as to rotate the substrate G held on the spin chuck 121 at a third rotation speed. In short, a drying gas is kept continuously supplied onto the surface of the substrate G during rotation of the substrate G at the third rotation speed so as to dry the substrate G (step S7).

The third rotation speed of the substrate G in step S7 is set at, for example, 1200 to 2000 rpm. In this case, the substrate surface can be dried in about 20 seconds. If the substrate G is rotated in step S7 at a rotation speed exceeding 2000 rpm, the washing liquid centrifugally removed from the substrate surface is scattered to form a mist. As a result, the washing liquid is attached again to the substrate surface. On the other hand, if the rotation speed of the substrate G in step S7 is lower than 1200 rpm, the drying time is rendered excessively long.

After the drying in step S7, supply of the drying gas from the nozzle 151 positioned above the cup 122 is stopped. Also, the rotation of the motor 125 is stopped under control by the control means 127 so as to stop rotation of the substrate G held by the spin chuck 121, thereby finishing the treatment in the developing unit 120 (step 8).

Then, the main arm 74a of the processing system shown in FIG. 2 is moved to enter the developing unit 120 so as to receive the substrate G held on the spin chuck 121. Then, the main arm 74a is moved out of the developing unit 120, thereby unloading the substrate G from the developing unit 120 (step S9).

Support pins 117 similar to the support pins 17 used in the first embodiment and a mechanism relating to the support pins 117 are also used in the second embodiment as shown in FIG. 11. These support pins 117 are the same in function as the support pins 17 described in conjunction with the first embodiment. To reiterate, these support pins 117 make it possible to prevent the substrate G from being bent, leading to a uniform coating of a process solution.

In the second embodiment, the processing method of the present invention is applied to a developing unit incorporated in the process system of an LCD substrate. However, the method of the present invention can also be employed for an etching treatment, a washing treatment, etc. Also, the present invention can also be employed for the processing of other substrates such as a silicon wafer. Further, the washing liquid supply nozzle 150 can be constructed to be movable over and across the cup 122 like the developing solution supply nozzle 155. Still further, the drying gas supply nozzle 151 can be made stationary.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A processing apparatus, comprising:

holding means for rotatably holding a substrate to be processed;

support means for supporting an overhanging portion of the substrate extending over an edge of the holding means so as to maintain the substrate surface horizontally flat;

process solution supply means for supplying a process solution to a front surface of the substrate held by said holding means and supported by said support means;

lift means for vertically moving the substrate held by the holding means relative to the support means; and rotating means for rotating the substrate moved upward relative to the support means.

2. The processing apparatus according to claim 1, wherein a washing liquid flow-out section is formed at the tip of the support portion of said support means.

3. The processing apparatus according to claim 1, further comprising drying means for blowing a drying gas against the tip of the support portion of the support member.

4. The processing apparatus according to claim 1, further comprising means for supplying an after-treating liquid to the front surface of the substrate and also supplying a washing liquid to a rear surface of the substrate.

5. The processing apparatus according to claim 1, further comprising:

a recovery vessel arranged to surround the substrate;

process solution recovery means which permits rotating the substrate at a first rotation speed so as to recover the process solution centrifugally removed from the substrate in said recovery vessel;

washing means which permits supplying a washing liquid onto the front surface of the substrate and also permits rotating the substrate at a second rotation speed so as to wash the substrate; and drying means which permits rotating the substrate at a third rotation speed so as to dry the substrate.

6. The processing apparatus according to claim 5, wherein said first rotation speed is 50 to 150 rpm, said second rotation speed is 100 to 200 rpm, and said third rotation speed is 1200 to 2000 rpm.

7. The processing apparatus according to claim 5, wherein said process solution recovery means serves to supply a washing liquid onto the front surface of the substrate.

8. The processing apparatus according to claim 5, wherein said washing means serves to supply a washing liquid onto the front surface of the substrate.

9. The processing apparatus according to claim 5, wherein said drying means serves to supply a drying gas onto the front surface of the substrate.

10. The processing apparatus according to claim 5, wherein said substrate is rectangular and said process solution supply means is moved along the shorter side of the rectangular substrate for supplying a process solution onto the front surface of the substrate.

11. A processing method, comprising the steps of:

(a) coating a front surface of a substrate to be processed with a process solution, said substrate being held by holding means and having an overhanging portion, which extends over an edge of said holding means, supported by support means to maintain said front surface of the substrate horizontally flat;

(b) moving upward the substrate held by the holding means relative to said support means; and (c) rotating the holding means to centrifugally remove said process solution from the substrate.

12. The processing method according to claim 11, further comprising after said step (C) the step of supplying an after-treating liquid to the front surface of the substrate and also supplying a washing liquid to the rear surface of the substrate.

13. The processing method according to claim 11, wherein the washing liquid is allowed to flow out through the tip portion of the support means during said step (C).

14. The processing method according to claim 13, wherein a drying gas is blown against the tip portion of the support means after completion of the washing liquid flow-out from the tip portion of the support means.

15. The processing method according to claim 11, further comprising the steps of:

arranging a recovery vessel to surround the substrate;

rotating the substrate at a first rotation speed to centrifugally remove a process solution from the substrate surface, the removed process solution being recovered in said recovery vessel;

supplying a washing liquid onto the front surface of the substrate while rotating the substrate at a second rotation speed so as to wash the substrate; and rotating the substrate at a third rotation speed so as to dry the substrate.

16. The processing method according to claim 15, wherein said first rotation speed is 50 to 150 rpm, said second rotation speed is 100 to 200 rpm, and said third rotation speed is 1200 to 2000 rpm.

17. The processing method according to claim 15, wherein a washing liquid is supplied onto the front surface of the substrate in the step of recovering the process solution.

18. The processing method according to claim 15, wherein a washing liquid is supplied onto the front surface of the substrate in said washing step.

19. The processing method according to claim 15, wherein a recovery vessel is not arranged to surround the substrate in said washing step and drying step.

20. The processing method according to claim 15, wherein a drying air is supplied to the front surface of the substrate in said drying step.

21. The processing method according to claim 15, wherein said substrate is rectangular and said process solution supply means is moved along the shorter side of the rectangular substrate for supplying a process solution onto the front surface of the substrate.

* * * * *